United States Patent [19]
Barron et al.

[11] Patent Number: 6,008,525
[45] Date of Patent: *Dec. 28, 1999

[54] MINORITY CARRIER DEVICE COMPRISING A PASSIVATING LAYER INCLUDING A GROUP 13 ELEMENT AND A CHALCOGENIDE COMPONENT

[75] Inventors: Andrew R. Barron, Cambridge, Mass.; Aloysius F. Hepp, Bay Village; Phillip P. Jenkins, Cleveland Heights, both of Ohio; Andrew N. MacInnes, Quincy, Mass.

[73] Assignees: President and Fellows of Harvard College, Cambridge, Mass.; TriQuint Semiconductor, Inc., Hillsboro, Oreg.; The United States of America as represented by the Administrator of the National Aeronautics and Space Administration, Washington, D.C.

[*] Notice: This patent is subject to a terminal disclaimer.

[21] Appl. No.: 08/993,613

[22] Filed: Dec. 18, 1997

Related U.S. Application Data

[63] Continuation of application No. 08/369,346, Jan. 6, 1995, abandoned.

[51] Int. Cl.[6] ............................. H01L 23/58; H01L 29/78
[52] U.S. Cl. ..................... 257/629; 257/631; 257/632; 257/410; 257/556; 257/288; 257/279
[58] Field of Search ................... 257/556, 653, 257/654, 629–635, 619, 615, 612, 73, 200, 279, 288, 289, 290, 410; 438/38, 958

[56] References Cited

U.S. PATENT DOCUMENTS

| | | | |
|---|---|---|---|
| 3,758,875 | 9/1973 | Hayashi | 257/609 |
| 4,017,880 | 4/1977 | Kasami et al. | 257/101 |
| 4,095,011 | 6/1978 | Hawrylo et al. | 428/469 |
| 4,154,631 | 5/1979 | Schoolar | 257/289 |
| 4,320,178 | 3/1982 | Chemla et al. | 428/698 |
| 4,354,198 | 10/1982 | Hodgson et al. | 357/16 |
| 4,366,567 | 12/1982 | Eukuzawa et al. | 57/272 |
| 4,477,311 | 10/1984 | Mimura et al. | 156/643 |
| 4,506,281 | 3/1985 | Nishizawa et al. | 257/264 |
| 4,544,797 | 10/1985 | Hewig | 257/457 |
| 4,562,378 | 12/1985 | Tadanebu et al. | 257/103 |
| 4,728,616 | 3/1988 | Ankri et al. | 257/26 |
| 4,751,201 | 6/1988 | Nothenburg et al. | 257/632 |
| 4,811,077 | 3/1989 | Fowler et al. | 357/52 |
| 4,839,145 | 6/1989 | Gale et al. | 422/245 |
| 4,920,078 | 4/1990 | Bagley et al. | 257/626 |
| 4,935,384 | 6/1990 | Wanlass | 437/107 |
| 4,952,527 | 8/1990 | Calawa et al. | 437/107 |
| 5,051,786 | 9/1991 | Nicallian et al. | 257/65 |
| 5,117,267 | 5/1992 | Kimoto et al. | 257/76 |
| 5,124,278 | 6/1992 | Bohling et al. | 437/126 |
| 5,168,077 | 12/1992 | Ashizawa et al. | 437/107 |
| 5,177,567 | 1/1993 | Klersy et al. | 257/3 |
| 5,204,871 | 4/1993 | Larkins | 257/13 |
| 5,241,214 | 8/1993 | Herbots et al. | 257/649 |
| 5,247,533 | 9/1993 | Okazaki et al. | 257/13 |
| 5,281,831 | 1/1994 | Uemoto et al. | 257/86 |
| 5,300,320 | 4/1994 | Barron et al. | 427/249 |
| 5,326,425 | 7/1994 | Gedridge, Jr. | 117/104 |
| 5,335,219 | 8/1994 | Ovshinsky et al. | 369/288 |
| 5,340,408 | 8/1994 | Böer | 257/184 |
| 5,369,290 | 11/1994 | Kawasaki et al. | 257/64 |
| 5,379,720 | 1/1995 | Kuramata | 117/104 |
| 5,387,481 | 2/1995 | Radford et al. | 427/126.3 |
| 5,491,449 | 2/1996 | Johnson et al. | 330/269 |
| 5,596,522 | 1/1997 | Ovshinsky et al. | 257/3 |
| 5,738,721 | 4/1998 | Barron et al. | 117/104 |
| 5,760,462 | 6/1998 | Barron et al. | 257/629 |

*Primary Examiner*—Alexander Oscar Williams
*Attorney, Agent, or Firm*—Hamilton, Brooks, Smith & Reynolds, P.C.

[57] ABSTRACT

A minority carrier device includes at least one junction of at least two dissimilar materials, at least one of which is a semiconductor, and a passivating layer on at least one surface of the device. The passivating layer includes a Group 13 element and a chalcogenide component. Embodiments of the minority carrier device include, for example, laser diodes, light emitting diodes, heterojunction bipolar transistors, and solar cells.

16 Claims, 4 Drawing Sheets

6,008,525

MINORITY CARRIER DEVICE COMPRISING A PASSIVATING LAYER INCLUDING A GROUP 13 ELEMENT AND A CHALCOGENIDE COMPONENT

RELATED APPLICATION

This application is a continuation of U.S. Ser. No. 08/369,346, filed on Jan. 6, 1995 now abandoned, the entire teachings of which are incorporated herein by reference.

GOVERNMENT FUNDING

This invention was sponsored by SNF Grant No. CHE-9222498 and ONR Contract Numbers N00014-91-J-1934 and N00014-94-I-0609, and the government has certain rights to the invention.

BACKGROUND OF THE INVENTION

Minority carrier devices are electronic devices where performance is dominated by minority carrier behavior. There are many minority carrier devices in common use today. Examples of minority carrier devices are pn diodes laser diodes, light emitting diodes, heterojunction bipolar transistors (BHTs) and solar cells.

In operation, these devices develop large non-equilibrium concentrations of minority carriers within the device. Typically, the minority carriers must diffuse or recombine in a controlled and efficient manner in order to optimize device performance. Nearly all minority carrier devices suffer from parasitic losses due to minority carrier recombination at the surfaces of the devices. These losses can greatly reduce device performance. The quality of a surface is often characterized by the quantity "surface recombination velocity" (SRV). For most devices, high device performance is achieved with low SRV on device surfaces. In many cases where the device geometry is dominated by high surface area (as is the case with very small devices) the major performance limiting parameter is surface recombination. Unfortunately, most semiconductor materials have very high SRV on free surfaces.

Semiconductor lasers have optical and electrical parasitic losses associated with free surfaces. Defect states absorb laser light, causing nonuniform heating of the laser facet. This can limit light output, causing a catastrophic collapse of the laser device.

In the specific case of a Schottky barrier photodiode, the barrier height of many devices is typically limited by electronically active surface states between the metal-semiconductor junction.

Use of AlGaAs as a passivating layer has at least two problems. First, AlGaAs rapidly oxidizes making it unsuitable as the top window layer. Thus additional complex process steps are required at present. Second, the temperatures required in the deposition of AlGaAs are high, in some cases causing damage to the cell structure, and thus lowering the fabrication yield of the cell.

The most pervasive problem in processing such devices is the lack of a high quality passivating layer for III–V surfaces. A poorly passivated surface generates a large number of recombination centers and gives rise to parasitic losses that lower device efficiency. This ultimately limits how small a device can be made, as the ratio of exposed surface area to total device area increases as the device is scaled down. The surface of GaAs can be passivated using AlGaAs, but this is not always compatible with device fabrication techniques. Laser diodes are an example of devices that do not lend themselves to AlGaAs passivation.

For example, the degradation of III–V diode laser performance during operation has been well documented (F. A. Houle, D. L. Neiman, W. C. Tang, and H. J. Rose, *J. Appl. Phys.* 1992, 72, 3884). The high current and optical densities present in these structures leads to considerable heating effects due to the presence of non-radiative recombination centers. Whereas the precise mechanisms of degradation are not entirely clear, it is apparent that the creation of defects at the optical facet surface or near surface region plays a significant role in the failure of laser diodes. The facet surface is, at the onset of laser operation, an area of high surface states and, hence, non-radiative recombination centers. Localized heating combined with high electric fields, therefore, allows this surface region to exhibit a higher generation of defects which, in turn, causes a further increase in the heating effect. Diode failure or degradation is, naturally, dependent on laser design and operating parameters, but, in many cases is catastrophic in nature as a result of the self-sustained heating induced by defect states. In this respect, laser facet quality is very often the limiting factor in device performance and failure.

Therefore, a need exists for minority carrier devices which overcome or minimize the above-referenced problems.

SUMMARY OF THE INVENTION

The present invention relates to a minority carrier device. The minority carrier device includes at least one junction of at least two dissimilar materials, at least one of which is a semiconductor. A passivating layer is on at least one surface of the device. The passivating layer includes a Group 13 element and a chalcogenide component. Examples of specific embodiments of the minority carrier device of the invention include laser diodes, light-emitting diodes, heterojunction bipolar transistors, and solar cells.

The present invention has many advantages. For example, the minority carrier device of the invention employs a passivating layer that is an alternative to passivating layers formed of AlGaAs. The minority carrier device of the invention has a surface recombination velocity that is significantly reduced, thereby resulting in significantly increased performance. Further, the minority carrier device of the invention is easier to fabricate and, consequently, can be produced at much lower costs than known minority carrier devices.

DETAILED DESCRIPTION OF THE INVENTION

The features and other details of the invention, either as steps of the invention or as combinations of parts of the invention, will now be more particularly described and pointed out in the claims. It will be understood that the particular embodiments of the invention are shown by way of illustration and not as limitations of the invention. It will also be understood that the same number present in different figures identifies the same item. The principal features of the invention may be employed in various embodiments without departing from the scope of the invention.

The present invention is a minority carrier device that includes at least one junction of at least two dissimilar materials, at least one of which is a semiconductor, and a passivating layer on at least one surface of the device. The passivating layer includes a Group 13 element and a chalcogenide component.

Figure 1:
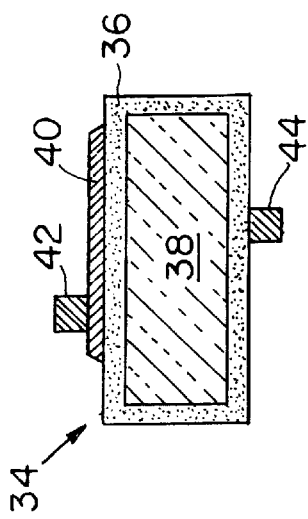
FIG. 1 is a section view of one embodiment of a minority carrier of the invention.

A cross-section of a specific embodiment of the invention is represented by FIG. 1, which depicts minority carrier device 10. Minority carrier device 10 includes junction 12 of dissimilar materials. At least one of the dissimilar materials is a semiconductor. In one embodiment, material 14 is an n-type material and material 16 a p-type material. Junction 12 can be a homojunction or a heterojunction.

Passivating layer 18 is disposed on at least one surface of minority carrier device 10. In the embodiment shown in FIG. 1, passivating layer 18 extends across junction. Passivating layer 18 includes at least one Group 13 element and at least one chalcogenide component. An example of a suitable Group 13 element is gallium. Examples of suitable chalcogenide components include sulfur, selenium, and tellurium. An example of a suitable semiconductor material of the n-type and/or p-type semiconductor, if employed, is gallium arsenide.

Passivating layer 18 is formed by a suitable method, such as is taught in U.S. Pat. No. 5,300,320, issued on Apr. 5, 1994, to Barron, et al., the teachings of which are incorporated herein by reference in its entirety. In general, the methods of forming the devices of the invention can employ the teachings of U.S. Pat. No. 5,241,214, and U.S. Pat. No. 4,774,205, the teachings of the entirety of which are incorporated by reference.

Figure 2:
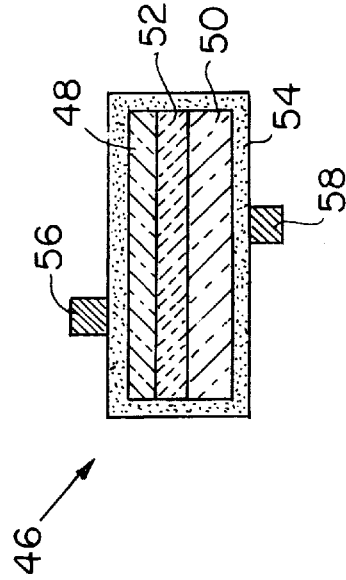
FIG. 2 is a section view of an embodiment of the minority carrier of the invention wherein electrical contacts are located at the junction material of the minority carrier.

FIG. 2 is a cross-section of another embodiment of a minority carrier device of the invention. Minority carrier device 20 includes junction 22 of a suitable n-type material and a suitable p-type material, at least one of which is a semiconductor, as is described with regard to FIG. 1. Electrical contacts 24,26 are located on n-type material 28 and p-type material 30, respectively. Examples of suitable materials for forming electrical contacts include gold, a gold-based alloy, etc. Passivating layer 32 is disposed on n-type material 28 and p-type material 30.

Figure 3:
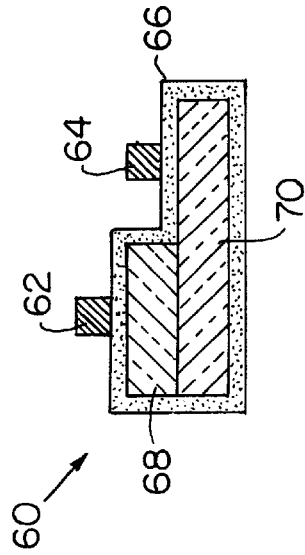
FIG. 3 is a section view of a minority carrier of the invention having electrical contacts disposed at a passivating layer of the minority carrier.

In still another embodiment of the minority carrier device of the invention, shown in FIG. 3, electrical contacts are disposed on passivating layer 30. It is to be understood that although FIGS. 4 through 6 show electrical contacts on passivating layers, the electrical contacts could alternatively be in direct contact with the substrate material, or materials, on which the passivating layer is disposed.

Figure 4:
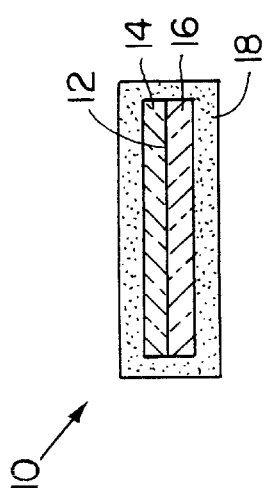
FIG. 4 is a section view of a minority carrier device of the invention which includes a Schottky barrier.

FIG. 4 is a section view of an embodiment of the minority carrier device of the invention, wherein the junction is a Schottky barrier. In this embodiment 34, passivating layer 36 is disposed on semiconductor 38. Semiconductor 38 is formed of a suitable material, such as n-GaAs. A suitable metal, such as gold, is disposed as layer 40 on passivating layer 36. Electrical contact 42 is located on layer 40. Second electrical contact 44 is located on passivating layer 36. General descriptions of Schottky barrier devices can be found in: "Solid State Electronic Devices," 3rd edition, by Ben G. Streetman, LC No.: TK7871.85.S77, Prentice Hall, Inc., Englewood Cliffs, N.J., 1990, pp. 184 and 185; and "Semiconductor Physics," by S. M. Sze, LC No.: TK7871.85.S9883, John Wiley & Sons, New York, 1985, pp. 281–284 the teachings of the entirety of which are incorporated by reference.

Figure 5:
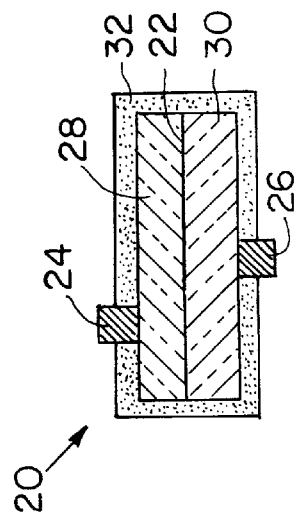
FIG. 5 is a section view of a minority carrier device having a p-type/intrinsically doped/n-type junction.
Figure 6:
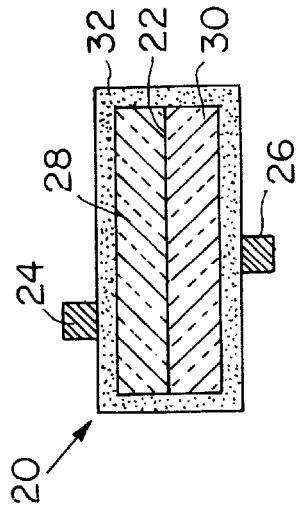
FIG. 6 is a section view of an alternative embodiment of a minority carrier device of the invention having electrical contacts on the same side of the device.

Still another embodiment of the invention is shown in FIG. 5. Minority carrier device 46 of FIG. 5 includes a p-type/doped/n-type junction (pin junction). The pin junction includes n+ semiconductor layer 48, p+ semiconductor layer 50 and doped semiconductor layer 52 disposed between n+ semiconductor layer 48 and p+ semiconductor layer 50. An example of a suitable material of formation of n+ semiconductor layer 48 and p+ semiconductor layer 50 is gallium arsenide. An example of a suitable doped semiconductor layer material is gallium arsenide doped with chromium. An intrinsically doped gallium arsenide is an alternative semiconductor layer disposed between n+ semiconductor layer 48 and p+ semiconductor layer 50. Passivating layer 54 is disposed on the pin junction. As with all of the minority carrier devices, passivating layer 54, alternatively, can be disposed across junction between n-type and p-type materials or disposed across only a single component of the junction, or combinations thereof. Electrical contacts 56,58 are disposed at passivating layer 54.

In another embodiment, the junctions of the minority carrier device can be heterojunctions For example, n+ semiconductor layer 48 and p+ semiconductor layer 50 can be formed of a suitable material, such as AlGaAs, and semiconductor layer 52 can be intrinsically doped GaAs.

It is to be understood that electrical contacts need not be on opposite sides of the minority carrier device. For example, as shown in FIG. 6, minority carrier device 60 includes electrical contacts 62,64 disposed on the same side of passivating layer 66 but, wherein one electrical contact 62 is most proximate to n-type semiconductor layer 68 and another electrical contact 64 is most proximate to p-type semiconductor layer 70.

Figures 7A, 7B, 7C, 7D:
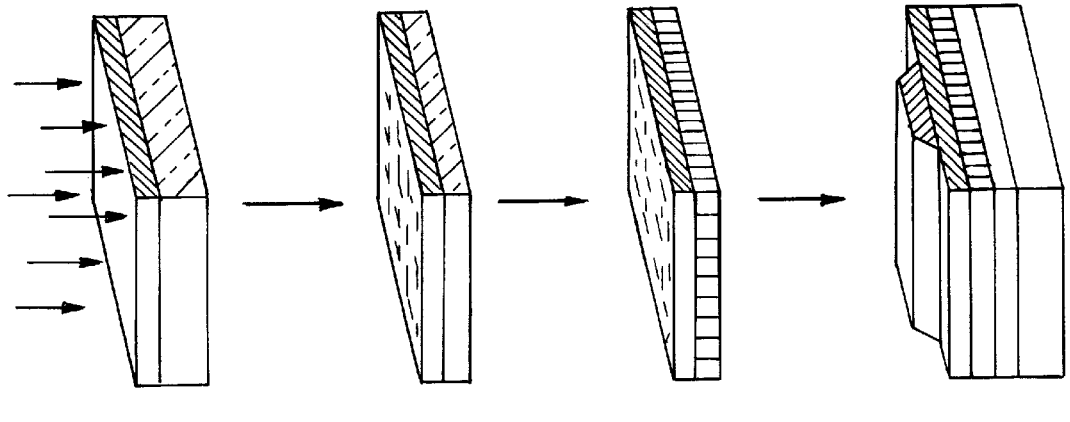
FIGS. 7A through 7D show perspective views of the steps of formation of metallization and cleaving steps during formation of a minority carrier device of the invention which is a laser diode.

In one specific embodiment, the minority carrier device of the invention is a laser diode. Steps in the fabrication of a laser diode are represented in FIGS. 7A through 7D. Fabrication of a laser diode begins with epitaxial growth of a laser structure on a wafer followed by deposition of contact metallization, such as is shown in FIG. 7A. Wafers are then thinned and front and back contacts are deposited, as shown in FIG. 7B. As shown in FIG. 7C, the wafer is cleaved into individual lasers. The cleaved sides form the residence cavity of the laser, as shown in FIG. 7D. The cleaved surfaces cannot be passivated with AlGaAs because the growth temperatures needed (about 600° C.) will destroy contact metallization. Metallization of the laser diode before cleaving does not permit AlGaAs regrowth after the diode is cleaved.

Figure 8:
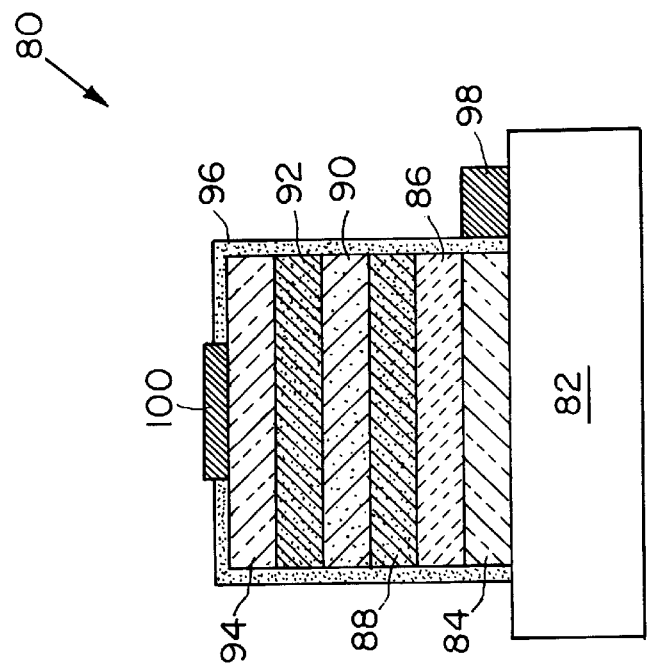
FIG. 8 is a section view of an embodiment of the minority carrier device of the invention which is a laser diode.

An embodiment of a laser diode structure of the invention is shown in FIG. 8. Laser diode 80 includes: heat sink base 82; substrate n+ GaAs layer 84; n GaAs layer 86; AlGaAs layer 88; InGaAs layer 90; AlGaAs layer 92; and p GaAs layer 94. Gallium sulfide passivation layer 96 is disposed about the previously described stack of junction materials. Base contact 98 is disposed on heat sink base 82. Top contact 100 is disposed on p GaAs layer 94.

In one embodiment, the laser is a 980 nm $In_{0.2}Ga_{0.8}As$ strained-layer quantum-well (SLQW) ridge waveguide diode with bare facets. Generally, this material would have mirror facet coatings to provide the optical resonant cavity required for optimal laser emission. Such coatings, while not providing electronic passivation, do afford protection from atmospheric contaminants that may react with the heated facet. Generally, to negate the effect of a bare facet, the laser diode would be operated under short pulse drive. Short pulses minimize the heat buildup in the laser and thus allow laser failure to be induced by instabilities under the high current densities rather than by facet/ambient interactions. The light emission from such a structure originates from both within the active InGaAs layer and to a much greater extent from the surrounding AlGaAs/GaAs confinement layer. The substrate to be passivated is therefore not a single monolithic material, but rather a multilayer structure of latticed matched Group 13–Group 15 materials.

Figure 9A:
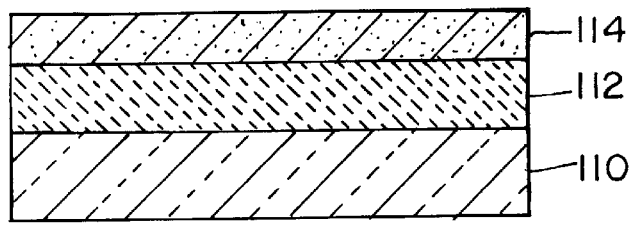
FIGS. 9A through 9D show steps of the formation of an embodiment of the minority carrier device of the invention which is a solar cell.
Figure 9B:
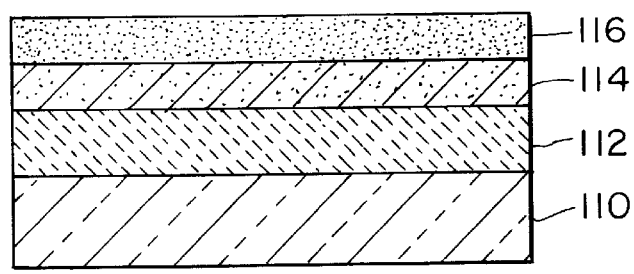
Figure 9C:
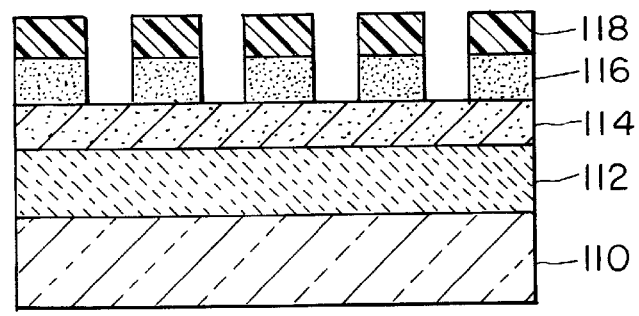
Figure 9D:
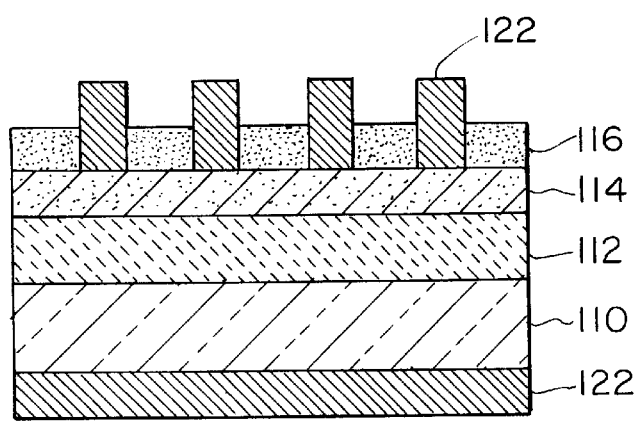

Another embodiment of the minority carrier device of the invention is a solar cell. In one embodiment, the solar cell is a gallium sulfide passivated Group 13–15 solar cell. FIG. 9A through 9D shown section views of a solar cell of the invention during various stages of fabrication. FIG. 9A shows n+ GaAs substrate 110 having n GaAs layer 112, of about 3000 Å in depth, disposed thereon. p+ $GaInP_2$ layer 114 is then disposed on n GaAs layer 112 by metal organic chemical vapor deposition. The thickness of p+ $GaInP_2$ layer 114 is typically about 2,000 Å. As shown in FIG. 9B, p+ $GaInP_2$ layer 114 is passivated with gallium sulfide by metal organic chemical vapor deposition to form GaS layer 116 of about 500 Å. Gallium sulfide layer 116 is then exposed to photolithography, employing mask 118, to define exposed areas of p+ $GaInP_2$ layer 114, as shown in FIG. 9C, for subsequent metallization and etching. Consequently, rear metallization layer 120 is formed on n+ GaAs layer and contacts 122 are formed as shown in FIG. 9D.

Typically, the solar cells are homoepitaxially MOCVD grown structures, with front and back contacts. Gallium sulfide is generally deposited at temperatures of 400° C. or below. The base layer of the solar cell is usually between about 3 and 4 microns and the emitter is on an order of 2,000 Å. Typical built-in levels for p+ is $3 \times 10^{18}$, while for n=$1 \times 10^{16}$ and n+=$4 \times 10^{18}$ are usual.

The invention will now be further and specifically described by the following examples. All parts and percentages are by weight unless otherwise specified.

EXAMPLES

Figure 10:
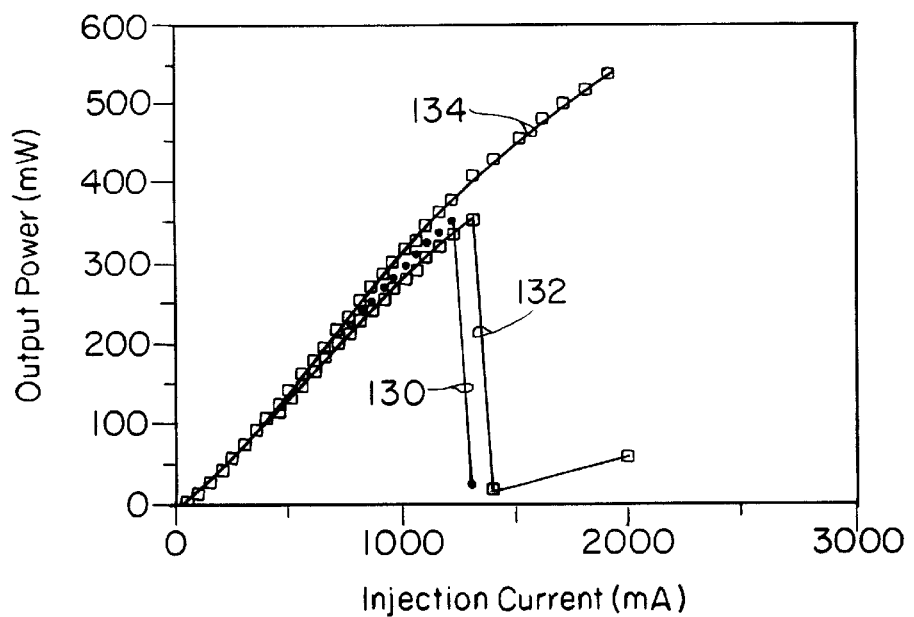
FIG. 10 is a plot of optical power versus drive current for two bare lasers and of a laser that has been passivated by gallium sulfide.

The laser diode represented in FIG. 8 was analyzed by employing a pulsed to drive current up to diode failure. Only results that were found to have exhibited COD by facet induced failure were considered valid. Optical power output (L) from a single facet as a function of drive current (I) was recorded and the point at which catastrophic failure occurred was determined. The results of the COD analysis for cubic-GaS coated InGaAs SLQW lasers are shown in the plot of FIG. 10. Lines 130, 132 represent plots for bare lasers. Line 134 represents the plot for a gallium sulfide coated laser. Table I, shown below, lists the COD limit for bare versus cubic-gallium arsenide coated 980 nm InGaAs laser diodes.

TABLE I

| DIODE STRUCTURE | COD LIMIT (mW) |
| --- | --- |
| Uncoated | 350 |
| Cubic-GaS coated facet | 540 |

A 54% increase in COD limit was observed, which was a dramatic demonstration of facet passivation, even when noting that a bare facet could exhibit a slightly reduced COD limit simply due to atmospheric interactions under current drive.

Figure 11:
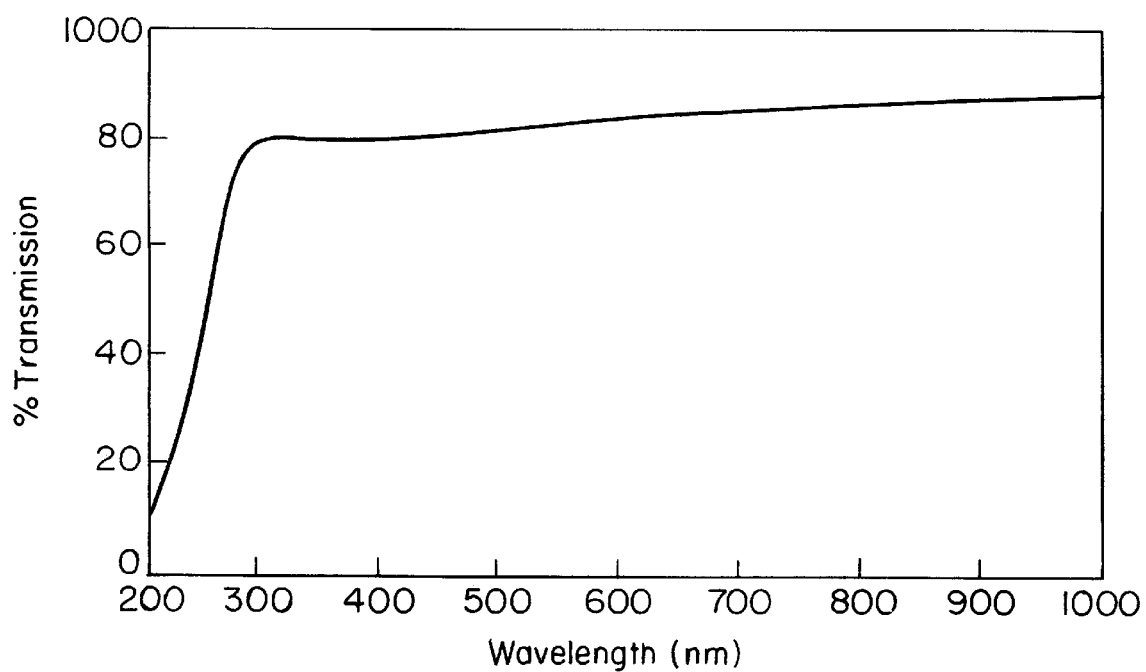
FIG. 11 is a plot of percent transmission versus wave length of cubic gallium sulfide.

In the case of applications for solar cells, lasers and diodes, the passivation layer must be transparent to light of the frequencies generated or used by the device. Cubic gallium sulfide displays a large band gap-ca. 5 eV as measured by optical absorption techniques, and shown in FIG. 11, which is a plot of percent transmission versus wave length spectra of cubic gallium sulfide.

Equivalents

Those skilled in the art will recognize, or be able to ascertain using no more than routine experimentation, many equivalents to the specific embodiments of the invention described specifically herein. Such are intended to be encompassed by the following claims.

We claim:

1. A minority carrier device, comprising:
    a) at least one junction of at least two dissimilar materials, at least one of which is a semiconductor; and
    b) a passivating layer of greater than monolayer thickness on at least one surface of the device, said passivating layer consisting essentially of a Group 13 element and a chalcogenide component selected from the group consisting of sulfur, selenium and tellurium.
2. The device of claim 1, wherein the junction is a pn junction.
3. The device of claim 2, wherein the pn junction is a homojunction.
4. The device of claim 2, wherein the pn junction is a heterojunction.
5. The device of claim 1, wherein the junction is a Schottky barrier.
6. The device of claim 1, wherein the junction is a p-type/intrinsically doped/n-type junction.
7. The device of claim 1, wherein the junction is a heterojunction.
8. The device of claim 1, wherein the chalcogenide component includes sulfur.
9. The device of claim 1, wherein the chalcogenide component includes selenium.
10. The device of claim 1, wherein the chalcogenide component includes tellurium.
11. The device of claim 1, wherein the device is a laser diode.
12. The device of claim 1, wherein the device is a light emitting diode.
13. The device of claim 1, wherein the device is a heterojunction bipolar transistor.

14. The device of claim 1, wherein the device is a solar cell.

15. A minority carrier device, comprising:
a) at least one junction of at least two dissimilar materials, at least one of which is a semiconductor; and
b) a cubic phase passivating layer of greater than monolayer thickness on at least one surface of the device, said passivating layer consisting essentially of a Group 13 element and a chalcogenide component selected from the group consisting of sulfur, selenium and tellurium.

16. The minority carrier device of claim 15 wherein the cubic phase passivating layer consists essentially of gallium sulfide.

* * * * *

UNITED STATES PATENT AND TRADEMARK OFFICE
CERTIFICATE OF CORRECTION

PATENT NO. : 6,008,525
DATED : December 28, 1999
INVENTOR(S) : Andrew R. Barron, Aloysius F. Hepp, Phillip P. Jenkins and Andrew N. MacInnes It is certified that error appears in the above-identified patent and that said Letters Patent is hereby corrected as shown below:

At Claim 15, line 6, after "said" insert --cubic phase--.

Signed and Sealed this

Twenty-sixth Day of December, 2000

Attest:

Q. TODD DICKINSON

Attesting Officer

Director of Patents and Trademarks